United States Patent
Vuong et al.

(10) Patent No.: US 7,171,284 B2
(45) Date of Patent: Jan. 30, 2007

(54) OPTICAL METROLOGY MODEL OPTIMIZATION BASED ON GOALS

(75) Inventors: Vi Vuong, Fremont, CA (US); Emmanuel Drege, San Jose, CA (US); Shifang Ll, Pleasanton, CA (US); Junwei Bao, Sunnyvale, CA (US)

(73) Assignee: Timbre Technologies, Inc., Santa Clara, CA (US)

( * ) Notice: Subject to any disclaimer, the term of this patent is extended or adjusted under 35 U.S.C. 154(b) by 199 days.

(21) Appl. No.: 10/946,729

(22) Filed: Sep. 21, 2004

(65) Prior Publication Data

US 2006/0064280 A1    Mar. 23, 2006

(51) Int. Cl.
  *G06F 19/00* (2006.01)
  *H01L 21/00* (2006.01)
(52) U.S. Cl. ............ 700/121; 438/16; 702/85; 703/6
(58) Field of Classification Search ......... 700/121; 438/16; 702/85; 703/6
  See application file for complete search history.

(56) References Cited

U.S. PATENT DOCUMENTS

| | | | |
|---|---|---|---|
| 6,785,638 | B2 | 8/2004 | Niu et al. |
| 6,891,626 | B2 | 5/2005 | Niu et al. |
| 6,943,900 | B2 | 9/2005 | Niu et al. |
| 2004/0017574 | A1 | 1/2004 | Vuong |
| 2004/0017575 | A1* | 1/2004 | Balasubramanian et al. .......... 356/625 |
| 2004/0109165 | A1* | 6/2004 | Fay et al. ............ 356/508 |
| 2004/0150838 | A1* | 8/2004 | Niu et al. ............ 356/625 |
| 2004/0176928 | A1* | 9/2004 | Johnson ............ 702/182 |
| 2004/0267397 | A1 | 12/2004 | Doddi |
| 2005/0057748 | A1* | 3/2005 | Vuong et al. ........ 356/237.5 |
| 2005/0128489 | A1* | 6/2005 | Bao et al. ............ 356/601 |
| 2005/0192914 | A1* | 9/2005 | Drege et al. ......... 706/12 |
| 2005/0209816 | A1* | 9/2005 | Vuong et al. ........ 702/167 |
| 2005/0256687 | A1* | 11/2005 | Niu et al. ............ 703/6 |
| 2006/0009872 | A1* | 1/2006 | Prager et al. ........ 700/121 |
| 2006/0064280 | A1* | 3/2006 | Vuong et al. ........ 702/182 |

OTHER PUBLICATIONS

Bevington et al., (1992) *Data Reduction and Error Analysis for the Physical Sciences*, Third Edition, McGraw-Hill, pp. 197-207.

(Continued)

*Primary Examiner*—Evan Pert
(74) *Attorney, Agent, or Firm*—Morrison & Foerster LLP

(57) ABSTRACT

The optimization of an optical metrology model for use in measuring a wafer structure is evaluated. An optical metrology model having metrology model variables, which includes profile model parameters of a profile model, is developed. One or more goals for metrology model optimization are selected. One or more profile model parameters to be used in evaluating the one or more selected goals are selected. One or more metrology model variables to be set to fixed values are selected. One or more selected metrology model variables are set to fixed values. One or more termination criteria for the one or more selected goals are set. The optical metrology model is optimized using the fixed values for the one or more selected metrology model variables. Measurements for the one or more selected profile model parameters are obtained using the optimized optical metrology model. A determination is then made as to whether the one or more termination criteria are met by the obtained measurements.

55 Claims, 6 Drawing Sheets

OTHER PUBLICATIONS

Haykin, S., (1999) *Neural Networks,* Prentice Hall.

Li, L., "Formulation and comparison of two recursive matrix algorithms for modeling layered diffraction gratings," *J. Opt. Soc. Am. A13,* pp. 1024-1035.

Mandell, J., (Jan. 1984) "Fitting Straight Lines when Both Variables are Subject to Error," *Journal of Quality Technology,* 16(1):1-14.

Niu, X., "An Integrated System of Optical Metrology for Deep Sub-Micron Lithography," Doctoral Thesis, University of California at Berkeley, Apr. 20, 1999.

* cited by examiner

OPTICAL METROLOGY MODEL OPTIMIZATION BASED ON GOALS

BACKGROUND

1. Field

The present application relates to optical metrology, and more particularly to optical metrology model optimization.

2. Related Art

Optical metrology involves directing an incident beam at a structure, measuring the resulting diffracted beam, and analyzing the diffracted beam to determine various characteristics, such as the profile of the structure. In semiconductor manufacturing, optical metrology is typically used for quality assurance. For example, after fabricating a periodic grating structure in proximity to a semiconductor chip on a semiconductor wafer, an optical metrology system is used to determine the profile of the periodic grating. By determining the profile of the periodic grating structure, the quality of the fabrication process utilized to form the periodic grating structure, and by extension the semiconductor chip proximate the periodic grating structure, can be evaluated.

In optical metrology, an optical metrology model is typically developed to measure a structure. The optical metrology model can be expressed using metrology model variables. In general, the greater the number of metrology model variables that are allowed to float in developing the optical metrology model, the greater the accuracy of the measurements obtained using the optical metrology model. However, increasing the number of metrology model variables allowed to float also increases the amount of time needed to develop the optical metrology model. Additionally, in some cases, allowing too many metrology model variables can produce erroneous measurements.

SUMMARY

In one exemplary embodiment, the optimization of an optical metrology model for use in measuring a wafer structure is evaluated. An optical metrology model having metrology model variables, which includes profile model parameters of a profile model, is developed. One or more goals for metrology model optimization are selected. One or more profile model parameters to be used in evaluating the one or more selected goals are selected. One or more metrology model variables to be set to fixed values are selected. One or more selected metrology model variables are set to fixed values. One or more termination criteria for the one or more selected goals are set. The optical metrology model is optimized using the fixed values for the one or more selected metrology model variables. Measurements for the one or more selected profile model parameters are obtained using the optimized optical metrology model. A determination is then made as to whether the one or more termination criteria are met by the obtained measurements.

DESCRIPTION OF DRAWING FIGURES

The present application can be best understood by reference to the following description taken in conjunction with the accompanying drawing figures, in which like parts may be referred to by like numerals:

DETAILED DESCRIPTION

The following description sets forth numerous specific configurations, parameters, and the like. It should be recognized, however, that such description is not intended as a limitation on the scope of the present invention, but is instead provided as a description of exemplary embodiments.

1. Optical Metrology

Figure 1:
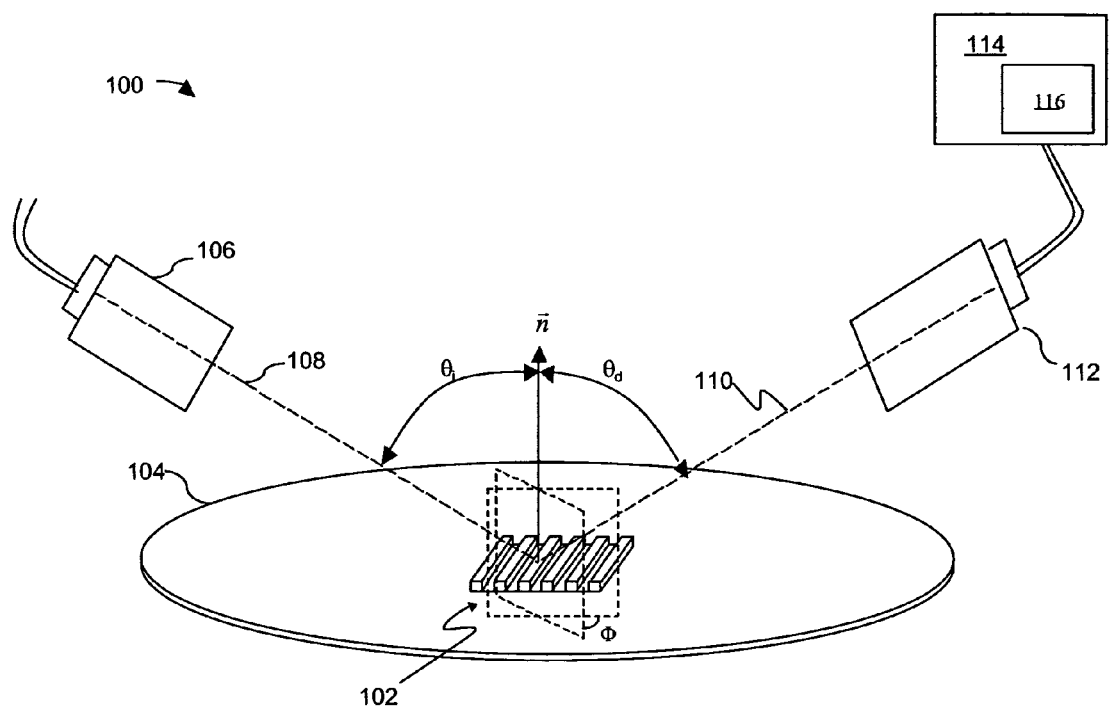
FIG. 1 depicts an exemplary optical metrology system.

With reference to FIG. 1, an optical metrology system 100 can be used to examine and analyze a structure. For example, optical metrology system 100 can be used to determine the profile of a periodic grating 102 formed on wafer 104. As described earlier, periodic grating 102 can be formed in test areas on wafer 104, such as adjacent to a device formed on wafer 104. Alternatively, periodic grating 102 can be formed in an area of the device that does not interfere with the operation of the device or along scribe lines on wafer 104.

As depicted in FIG. 1, optical metrology system 100 can include a photometric device with a source 106 and a detector 112. Periodic grating 102 is illuminated by an incident beam 108 from source 106. In the present exemplary embodiment, incident beam 108 is directed onto periodic grating 102 at an angle of incidence $\theta_i$ with respect to normal $\vec{n}$ of periodic grating 102 and an azimuth angle $\Phi$ (i.e., the angle between the plane of incidence beam 108 and the direction of the periodicity of periodic grating 102). Diffracted beam 110 leaves at an angle of $\theta_d$ with respect to normal $\vec{n}$ and is received by detector 112. Detector 112 converts the diffracted beam 110 into a measured diffraction signal.

To determine the profile of periodic grating 102, optical metrology system 100 includes a processing module 114 configured to receive the measured diffraction signal and analyze the measured diffraction signal. As described below, the profile of periodic grating 102 can then be determined using a library-based process or a regression-based process. Additionally, other linear or non-linear profile extraction techniques are contemplated.

2. Library-Based Process of Determining Profile of Structure

In a library-based process of determining the profile of a structure, the measured diffraction signal is compared to a library of simulated diffraction signals. More specifically, each simulated diffraction signal in the library is associated with a hypothetical profile of the structure. When a match is made between the measured diffraction signal and one of the simulated diffraction signals in the library or when the difference of the measured diffraction signal and one of the simulated diffraction signals is within a preset or matching criterion, the hypothetical profile associated with the matching simulated diffraction signal is presumed to represent the actual profile of the structure. The matching simulated diffraction signal and/or hypothetical profile can then be utilized to determine whether the structure has been fabricated according to specifications.

Thus, with reference again to FIG. 1, in one exemplary embodiment, after obtaining a measured diffraction signal, processing module 114 then compares the measured diffraction signal to simulated diffraction signals stored in a library 116. Each simulated diffraction signal in library 116 can be associated with a hypothetical profile. Thus, when a match is made between the measured diffraction signal and one of the simulated diffraction signals in library 116, the hypothetical profile associated with the matching simulated diffraction signal can be presumed to represent the actual profile of periodic grating 102.

The set of hypothetical profiles stored in library 116 can be generated by characterizing a hypothetical profile using a set of parameters, then varying the set of parameters to generate hypothetical profiles of varying shapes and dimensions. The process of characterizing a profile using a set of parameters can be referred to as parameterizing.

Figure 2A:
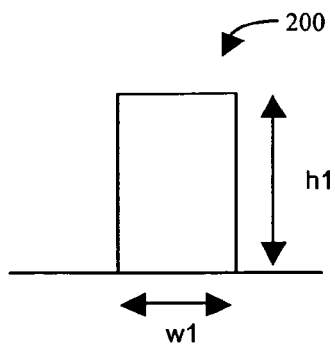
FIGS. 2A–2E depict various hypothetical profiles of a structure.
Figure 2B:
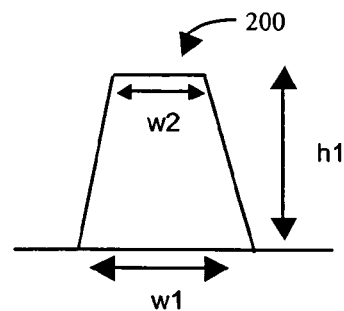
Figure 2C:
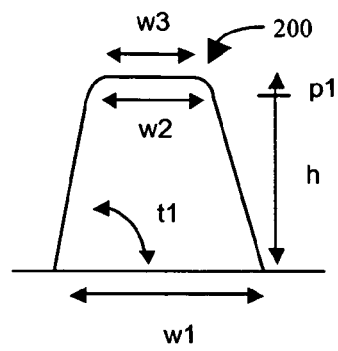
Figure 2D:
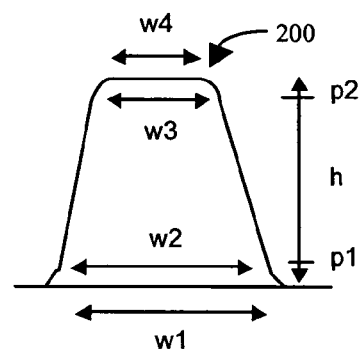
Figure 2E:
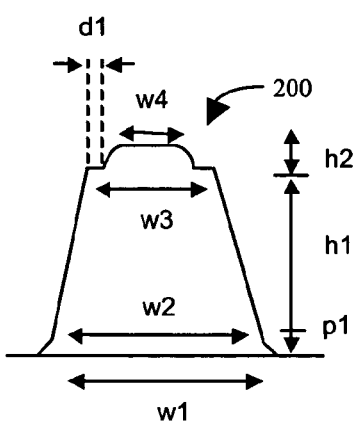

For example, as depicted in FIG. 2A, assume that hypothetical profile 200 can be characterized by parameters h1 and w1 that define its height and width, respectively. As depicted in FIGS. 2B to 2E, additional shapes and features of hypothetical profile 200 can be characterized by increasing the number of parameters. For example, as depicted in FIG. 2B, hypothetical profile 200 can be characterized by parameters h1, w1, and w2 that define its height, bottom width, and top width, respectively. Note that the width of hypothetical profile 200 can be referred to as the critical dimension (CD). For example, in FIG. 2B, parameter w1 and w2 can be described as defining the bottom CD and top CD, respectively, of hypothetical profile 200.

As described above, the set of hypothetical profiles stored in library 116 (FIG. 1) can be generated by varying the parameters that characterize the hypothetical profile. For example, with reference to FIG. 2B, by varying parameters h1, w1, and w2, hypothetical profiles of varying shapes and dimensions can be generated. Note that one, two, or all three parameters can be varied relative to one another.

With reference again to FIG. 1, the number of hypothetical profiles and corresponding simulated diffraction signals in the set of hypothetical profiles and simulated diffraction signals stored in library 116 (i.e., the resolution and/or range of library 116) depends, in part, on the range over which the set of parameters and the increment at which the set of parameters are varied. In one exemplary embodiment, the hypothetical profiles and the simulated diffraction signals stored in library 116 are generated prior to obtaining a measured diffraction signal from an actual structure. Thus, the range and increment (i.e., the range and resolution) used in generating library 116 can be selected based on familiarity with the fabrication process for a structure and what the range of variance is likely to be. The range and/or resolution of library 116 can also be selected based on empirical measures, such as measurements using atomic force microscope (AFM), or a cross section scanning electron microscope (XSEM), a transmission electron microscope (TEM), and the like.

For a more detailed description of a library-based process, see U.S. patent application Ser. No. 09/907,488, titled GENERATION OF A LIBRARY OF PERIODIC GRATING DIFFRACTION SIGNALS, filed on Jul. 16, 2001, which is incorporated herein by reference in its entirety.

3. Regression-Based Process of Determining Profile of Structure

In a regression-based process of determining the profile of a structure, the measured diffraction signal is compared to a simulated diffraction signal (i.e., a trial diffraction signal). The simulated diffraction signal is generated prior to the comparison using a set of parameters (i.e., trial parameters) for a hypothetical profile (i.e., a hypothetical profile). If the measured diffraction signal and the simulated diffraction signal do not match or when the difference of the measured diffraction signal and one of the simulated diffraction signals is not within a preset or matching criterion, another simulated diffraction signal is generated using another set of parameters for another hypothetical profile, then the measured diffraction signal and the newly generated simulated diffraction signal are compared. When the measured diffraction signal and the simulated diffraction signal match or when the difference of the measured diffraction signal and one of the simulated diffraction signals is within a preset or matching criterion, the hypothetical profile associated with the matching simulated diffraction signal is presumed to represent the actual profile of the structure. The matching simulated diffraction signal and/or hypothetical profile can then be utilized to determine whether the structure has been fabricated according to specifications.

Thus, with reference again to FIG. 1, in one exemplary embodiment, processing module 114 can generate a simulated diffraction signal for a hypothetical profile, and then compare the measured diffraction signal to the simulated diffraction signal. As described above, if the measured diffraction signal and the simulated diffraction signal do not match or when the difference of the measured diffraction signal and one of the simulated diffraction signals is not within a preset or matching criterion, then processing module 114 can iteratively generate another simulated diffraction signal for another hypothetical profile. In one exemplary embodiment, the subsequently generated simulated diffraction signal can be generated using an optimization algorithm, such as global optimization techniques, which includes simulated annealing, and local optimization techniques, which includes steepest descent algorithm.

In one exemplary embodiment, the simulated diffraction signals and hypothetical profiles can be stored in a library 116 (i.e., a dynamic library). The simulated diffraction signals and hypothetical profiles stored in library 116 can then be subsequently used in matching the measured diffraction signal.

For a more detailed description of a regression-based process, see U.S. patent application Ser. No. 09/923,578, titled METHOD AND SYSTEM OF DYNAMIC LEARNING THROUGH A REGRESSION-BASED LIBRARY GENERATION PROCESS, filed on Aug. 6, 2001, which is incorporated herein by reference in its entirety.

4. Algorithm for Determining Simulated Diffraction Signal

As described above, simulated diffraction signals are generated to be compared to measured diffraction signals. As will be described below, in one exemplary embodiment, simulated diffraction signals can be generated by applying Maxwell's equations and using a numerical analysis technique to solve Maxwell's equations. More particularly, in the exemplary embodiment described below, rigorous coupled-wave analysis (RCWA) is used. It should be noted, however, that various numerical analysis techniques, including variations of RCWA, modal analysis, integral method, Green's functions, Fresnel method, finite element and the like can be used.

In general, RCWA involves dividing a profile into a number of sections, slices, or slabs (hereafter simply referred to as sections). For each section of the profile, a system of coupled differential equations generated using a Fourier expansion of Maxwell's equations (i.e., the components of the electromagnetic field and permittivity ($\epsilon$)). The system of differential equations is then solved using a diagonalization procedure that involves eigenvalue and eigenvector decomposition (i.e., Eigen-decomposition) of the characteristic matrix of the related differential equation system. Finally, the solutions for each section of the profile are coupled using a recursive-coupling schema, such as a scattering matrix approach. For a description of a scattering matrix approach, see Lifeng Li, "Formulation and comparison of two recursive matrix algorithms for modeling layered diffraction gratings," J. Opt. Soc. Am. A13, pp 1024–1035 (1996), which is incorporated herein by reference in its entirety. Specifically for a more detail description of RCWA, see U.S. patent application Ser. No. 09/770,997, titled CACHING OF INTRA-LAYER CALCULATIONS FOR RAPID RIGOROUS COUPLED-WAVE ANALYSES, filed on Jan. 25, 2001, which is incorporated herein by reference in its entirety.

5. Machine Learning Systems

In one exemplary embodiment, simulated diffraction signals can be generated using a machine learning system (MLS) employing a machine learning algorithm, such as back-propagation, radial basis function, support vector, kernel regression, and the like. For a more detailed description of machine learning systems and algorithms, see "Neural Networks" by Simon Haykin, Prentice Hall, 1999, which is incorporated herein by reference in its entirety. See also U.S. patent application Ser. No. 10/608,300, titled OPTICAL METROLOGY OF STRUCTURES FORMED ON SEMI-CONDUCTOR WAFERS USING MACHINE LEARNING SYSTEMS, filed on Jun. 27, 2003, which is incorporated herein by reference in its entirety.

6. Optimizing an Optical Metrology Model

Figure 3:
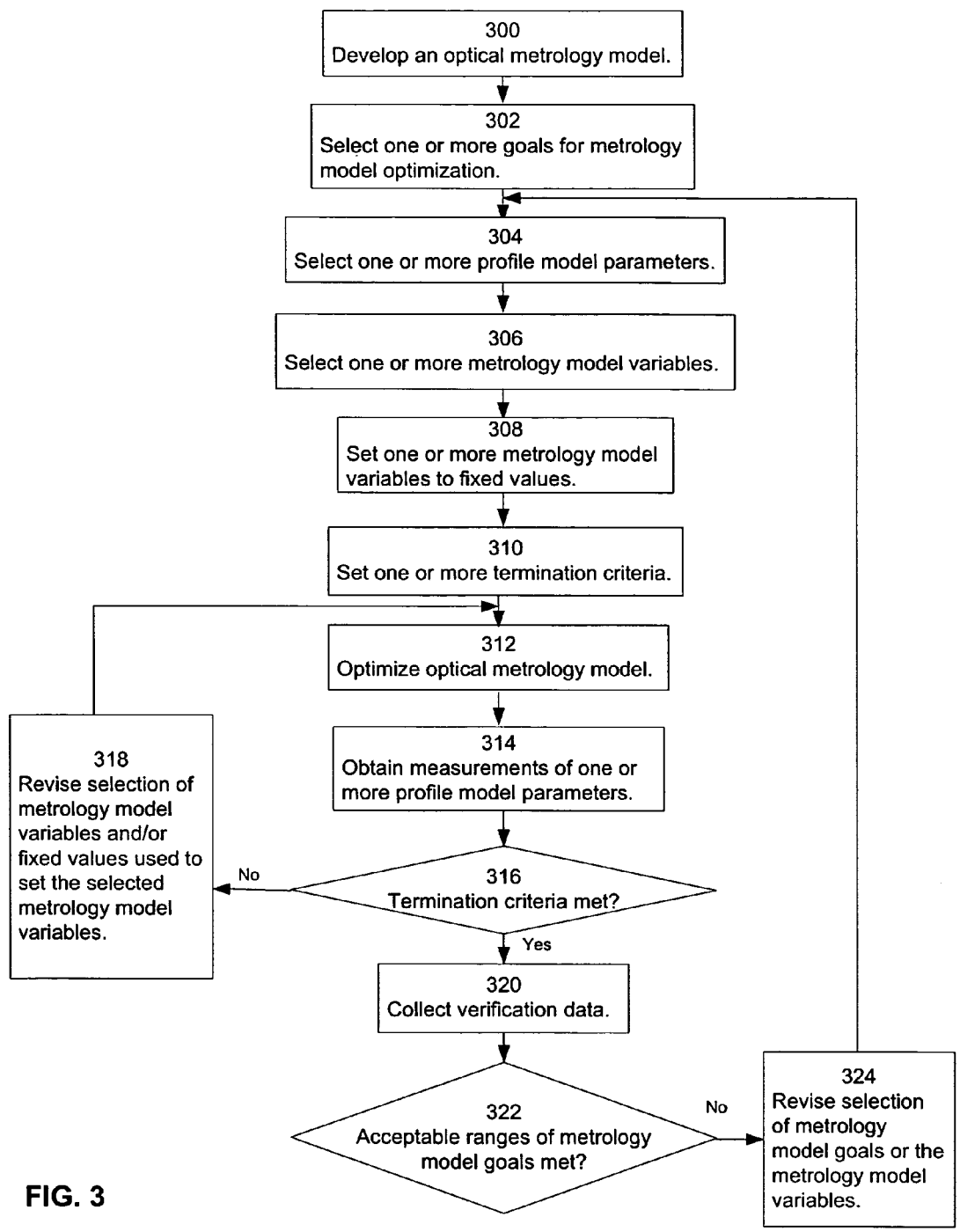
FIG. 3 is an exemplary process for optimizing an optical metrology model.

With reference to FIG. 3, an exemplary process is depicted for optimizing an optical metrology model. In step 300, an optical metrology model for a semiconductor structure is developed. An optical metrology model is typically expressed as a function of optical metrology variables related to the metrology device, materials and layers of the structure, profile model of the structure, the simulation technique, and the like. Optical metrology variables related to the metrology device include angle of incidence of the incident beam, beam intensity, wavelength calibration error, polarization dependent loss, spectrometer resolution, azimuth angle, numerical aperture, and the like. Optical metrology variables related to the materials and layers of the structure include the refractive indices (n), extinction coefficients (k), and the like. Optical metrology variables related to the profile model include the thickness of each of the underlying layers, the width of the structure at various points such as the bottom, the middle or the top, the sidewall angle, pitch, and the like. Optical metrology variables related to the simulation technique include wavelengths analyzed, resolution, diffraction orders, diffraction simulation algorithm, and the like. For an exemplary method of developing an optical metrology model, refer to the University of California at Berkeley Doctoral Thesis of Xinhui Niu, "An Integrated System of Optical Metrology for Deep Sub-Micron Lithography," Apr. 20, 1999, the entire content of which is incorporated herein by reference.

In step 302, one or more goals for the optical modeling optimization are selected. In general, a goal for optimization is a performance measure of the effectiveness of the process of optimization. More particularly, with regards to optical modeling, optimization goals are yardsticks used to measure the effectiveness of optimizing the optical metrology model. Examples of goals include accuracy of the measurement of the wafer structure, closeness of match of measurements made with different metrology systems, correlation coefficient, precision of the measurement, throughput, CD uniformity, goodness-of-fit, cost function, and the like.

Accuracy typically refers to how well the measured value matches the true value of the structure being measured. Since the true value of the structure being measured is generally not known, accuracy is typically expressed as the absolute value of the difference between the measured value using a metrology system and the measured value using a calibration standard. CDSEMs are typically calibrated using a pitch standard wherein the pitch of a line and space grating is certified. For scatterometry, the accuracy of a scatterometric measurement is evaluated by comparing the scatterometric measurement using a metrology device to a reference metrology measurement, most typically a CDSEM measurement. However, other reference metrology measurements using XSEM, CD-AFM, TEM, and the like may also be used.

Closeness of match of measurements made with different metrology systems as a goal may be expressed as an absolute measurement difference, average correlation ratio between a metrology system to a reference metrology system, standard mean deviation ($\sigma$), multiples of standard mean deviation, (such as $2\sigma$, $3\sigma$, or $4\sigma$), total measurement uncertainty (TMU), and the like. Absolute measurement difference is the absolute value of the difference between measurements of the same structure using two different metrology devices, calculated for one measurement or averaged over many measurements. The correlation of the measurements of a metrology device (a first metrology device) compared to measurements made with a reference metrology device (a second metrology device) may be expressed as TMU or correlation coefficient r. Used as goals, TMU may be expressed in terms of three performance measures: offset average, the slope $\beta$, and TMU. The definitions and derivations of these performance measures are described in the Mandel method with the pertinent equations shown below:

$$\beta = \frac{S_{yy} - \lambda S_{XX} + \sqrt{(S_{YY} - \lambda S_{XX})^2 + 4\lambda S_{YX}^2}}{2S_{YX}} \quad (4.10)$$

$$\hat{\sigma}_{MANDEL} = \sqrt{\frac{\sum_{i=1}^{N}\{(y_i - \hat{y}_i)^2 + (x_i - \hat{x}_i)^2\}}{N-2}} \quad (4.20)$$

$$TMU = 3\sqrt{\hat{\sigma}_{MANDEL}^2 - \hat{\sigma}_{RT}^2} \quad (4.30)$$

$$\text{Offset average} = (\bar{x} - \bar{y}) \quad (4.40)$$

where:

$$S_{YX} = \sum_{i=1}^{N}(y_i - \bar{y}_i)(x_i - \bar{x})$$

$$S_{XX} = \sum_{i=1}^{N}(x_i - \bar{x})^2$$

$\hat{\sigma}_{RT}$ is the measurement uncertainty of the second metrology device, $\hat{\sigma}_{NT}$ is the measurement uncertainty of the first metrology device, y represents values of measurement for the second metrology device, x represents values of measurement for the first metrology device, $$\lambda = \frac{\sigma_{RT}^2}{\sigma_{NT}^2}$$

is the Mandel parameter calculated as the ratio of the squared measurement uncertainty of the second metrology device to the squared measurement uncertainty of the first metrology device, and the caret symbol, for example $\hat{\sigma}_{NT}$, represents an estimate of the variable or quantity underneath it. For a discussion of the Mandel method, refer to J. Mandel, "Fitting Straight Lines when Both Variables are Subject to Error", Journal of Quality Technology, Vl. 16, No. 1, p. 1–14, January 1984, which is incorporated herein in its entirety.

Correlation coefficient r can be calculated using the formula:

$$r = \frac{\sum_i (x_i - \bar{x})(y_i - \bar{y})}{\sqrt{\sum_i (x_i - \bar{x})^2} \sqrt{\sum_i (y_i - \bar{y})^2}} \quad (2.60)$$

where $x_i$ and $y_i$ are a pair of variables such as the measurements made using a reference metrology device and measurements of the new metrology device, $\bar{x}$ is the mean of $x_i$'s and $\bar{y}$ is the mean of $y_i$'s. The value of r lies between –1 and +1 inclusive. A correlation coefficient value of +1 can correspond to complete positive correlation and a value of –1 can correspond to complete negative correlation. A value of r close to zero can correspond to the x and y optimization parameters not being correlated.

Precision is an indication of how repeatable a measurement can be made. The ideal case is that of measuring a profile model parameter, such as bottom CD, ten times and the measurements yield the exact same answer every time. Since there is always some amount of variation from one measurement to another, precision values are typically reported in terms of multiples of the standard deviation of the mean or the standard error, sigma σ. Typically, a three-sigma, (3σ), where the values included in the stated range represent 99.7% of the data population. It is understood that other statistical measures such as two-sigma, six-sigma and the like may be employed as well.

For optical metrology measurements, static precision, dynamic precision, and/or long term precision may be specified. Static precision refers to the variation in measured value when no movement of the wafer relative to the measurement optics occurs. Dynamic precision, also known as reproducibility, refers to the variation in measured value when the wafer is unloaded and reloaded between measurements. Long-term precision refers to the variation in measured value from lot to lot or over a period of time. In another embodiment, precision and accuracy of measurement may be selected as goals for the metrology model optimization.

Throughput goals are typically expressed as number of wafers per hour. CD uniformity is typically expressed as a range of variation of a CD measurement across a wafer or across several wafers. For example, a range of 10 nm may be set as a goal for the bottom CD of a structure across several selected sites in a wafer or across several wafers selected from a batch of wafers processed over a period of time. Goodness of fit and cost function are described in U.S. patent application Ser. No. 10/206,491 titled "Model And Parameter Selection For Optical Metrology", filed on Jul. 25, 2002, which is incorporated herein by reference in its entirety.

Goals may also involve aggregation of data, such as cost of ownership or return on investment. Cost of ownership related to metrology device may be expressed in term of cost per wafer, cost per die, cost per end product, and the like. Return on investment may be expressed as number of months or years needed to recoup the investment cost of a metrology device or pure percent return measured utilizing a discounted cash flow financial model.

Referring to FIG. 3, in step 304, one or more profile model parameters to be used in evaluating the one or more selected goals are selected. For example, assume the goal selected for metrology model optimization is precision of measurement. Assume that the bottom CD of the wafer structure is the profile model parameter that is selected to be used in evaluating the selected goal. Thus, in this example, either static and/or dynamic precision of the bottom CD is tracked when the optical metrology model is optimized. Evaluation of the goals is described in a step discussed below.

In step 306, one or more metrology model variables that are to be set to fixed values are selected. In step 308, the one or more selected metrology model variables are set to fixed values. For example, if the metrology device available for measurement is a single-wavelength ellipsometer, then the wavelength of the incident beam or beams can be the metrology model variable that is selected and set to a fixed value, such as the wavelength values for the specific ellipsometer used. If the metrology device is a reflectometer, the angle of incidence of the incident beam can be the metrology model variable that is selected and set to a fixed value, such as zero degrees from normal. Other metrology model variables related to the metrology device that can be selected and set to fixed values include beam intensity, wavelength calibration error, polarization dependent loss, spectrometer resolution, azimuth angle, numerical aperture, and the like. Metrology model variables related to the materials and layers of the structure that can be selected and set to fixed values include the refractive indices of the various underlying layers, the extinction coefficients of the various underlying layer, and the like. Metrology model variables related to the profile model that can be selected and set to fixed values include the thickness of each of the underlying layers, the width of the structure at various points, such as the bottom, the middle or the top, the sidewall angle, pitch, and the like. Metrology model variables related to the simulation technique that can be selected and set to a fixed value include type of diffraction simulation algorithm used, the wavelengths or range of wavelengths analyzed, resolution, number of layers to use in dividing up a hypothetical profile to generate a simulated diffraction signal, the number of harmonic orders to use in generating the set of simulated diffraction signals, and range of values of the profile model parameters may be set to fixed values.

Referring still to FIG. 3 in step 310, one or more termination criteria for evaluating the goals of optimization are set. Acceptable ranges or limit values of the goals may be used as termination criteria. If the goals for optimization included a precision goal, then the acceptable range of precision for the selected profile model parameters would be set. More specifically, if both static and dynamic precisions are specified, then values of standard deviations of the mean for both static and dynamic precisions may be set. For example, a 3σ value of 0.20 nm and 0.65 nm for the bottom CD of a structure for static and dynamic precision respectively, the 3σ calculated after 50 measurements of the structure may be set as the termination criteria for optical metrology optimization. Alternatively, precision and accuracy may be selected as goals for optimization. In this instance, the precision and accuracy ranges or limit values may be set as the termination criteria. For example, an underlying oxide thickness precision of 0.06 nm and 0.10 nm for static and dynamic precision respectively plus an accuracy of 1.50 nm. As mentioned above, goodness of fit may also be selected as a goal alone or in conjunction with other goals. In this connection, a goodness of fit of 0.95 may be set as the termination criterion or in conjunction with static and dynamic precision.

In step 312, the optical metrology model is optimized. In general, optimization of an optical metrology model is performed to minimize or maximize an objective function that depends on the set of optical metrology variables while satisfying selected constraints. If the objective function is goodness of fit, the objective function is maximized. If the objective function is an error metric, such as sum squared error (SSE) between the simulated diffraction signal and the measured diffraction signal, then the objective function is minimized. Other error metrics may be used, such as sum-squared-difference-log error and other least square errors. The selected constraints of the metrology model optimization are the selected termination criteria.

Optimization may be performed using local or global optimization or a combination of global and local optimization. Examples of global optimization techniques include simulated annealing, genetic algorithms, tabu search, neural networks, branch-and-bound technique, and the like. Examples of local optimization include steepest descent, least squares, hill climber, and the like. Examples of combination global and local optimization are simulated annealing combined with steepest descent and genetic algorithm combined with a steepest descent or hill climber and the like. Optimization of simulated-diffraction signals using rigorous models are discussed in University of California at Berkeley Doctoral Thesis of Xinhui Niu, "An Integrated System of Optical Metrology for Deep Sub-Micron Lithography," Apr. 20, 1999, the entire content of which is incorporated herein by reference. Optimization for profile model and profile model parameter selection, with the other metrology model variables, such as device, structure material, and simulation technique variables, set to fixed values, is described in U.S. patent application Ser. No. 10/206,491 titled "Model And Parameter Selection For Optical Metrology", filed on Jul. 25, 2002, which is incorporated herein by reference in its entirety.

In step 314, measurements of the one or more profile model parameters selected in step 304 are obtained using the optimized optical metrology model. For example, assuming that the bottom CD was the profile model parameter selected in step 304, bottom CD measurements are obtained using the optimized metrology model.

In step 316, a determination is made as to whether the one or more termination criteria have been met using the measurements obtained in step 314. Using the example described above, assume that the termination criteria set in step 310 was a 3σ value of less than or equal to 0.20 nm static precision and a 3σ value of less than or equal to 0.65 nm dynamic precision for the bottom CD of a structure. Further assume that 50 static and dynamic measurements are needed to get a representative sample size to calculate the static and dynamic precision 3σ values. Thus, based on 50 diffraction measurements of the bottom CD determined using the optimized optical metrology model in step 314, the 3σ values for static and dynamic precisions are calculated.

If the termination criteria are not met, in step 318, the selection of metrology model variables and/or the fixed values used to set the selected metrology model variables are revised, and then steps 312, 314, and 316 are iterated. In particular, some additional metrology model variables may be set to fixed values, some metrology model variables previously set to fixed values may be allowed to float, and/or the fixed values can be changed. For example, pitch may be allowed to float in a first iteration, and then set to a fixed value in a subsequent iteration. The thickness of an underlying layer in a patterned structure may be set to a fixed value in a first iteration, and then allowed to float in a subsequent iteration. The angle of incident radiation may be changed from one fixed value in a first iteration to another fixed value in a subsequent iteration.

In another embodiment, the one or more termination criteria may be changed to satisfy the requirements of the application. For example, assume that a 3σ value was previously used as a termination criterion. The termination criterion may be changed to a 4σ or 6σ value due to new considerations. Alternatively, additional termination criteria may be added. For example, in an expansion of the example above, a third termination criteria of TMU less than or equal to 6 nm may be set. For example, the TMU may be calculated by comparing 50 scatterometry measurements of the bottom CD using the optimized optical metrology model versus fifty measurements of the same bottom CD using a reference metrology device such as a CDSEM. Assume that the calculations of the static and dynamic precision values are the same as above. TMU is calculated using the values of the bottom CD from the scatterometric measurement and the CDSEM measurement, utilizing equation 4.30 above. If the value of the calculated 3σ static precision is less than or equal to 0.20 nm, the calculated 3σ dynamic precision is less than or equal to 0.65 nm, and the TMU is less than or equal to 6 nm, then the termination criteria are met. As mentioned above, the correlation coefficient r may be used instead of or in conjunction with TMU. Other correlation formulas may be used, such as the multiple-correlation coefficient R, which takes into account correlation of a group of variables taken simultaneously. For a detailed discussion and derivation of multiple-correlation coefficient R, refer to Bevington, et al., "Data Reduction and Error Analysis for the Physical Sciences", Third Edition, pages 197–207, which is incorporated herein in its entirety.

With reference to FIG. 3, if the termination criteria are met in step 316, the optimized optical metrology model is used to collect verification data in step 320. Verification data include profile model parameter values determined using the optimized optical metrology model. Depending on the selected goal, verification data may also include profile model parameter values obtained from reference metrology device measurements. Typically, the optimized optical metrology model is used to create a library or a training data set to train an MLS. The library or the MLS-trained system is used to determine the profile model parameters of the wafer structure from measurements of the diffraction signal using a metrology device. By way of example, assume that the optical metrology model for a given semiconductor application is optimized with accuracy of the bottom CD selected as a goal. Assume further that the selected accuracy goal is the difference of the bottom CD determined using the library or MLS-trained system and the bottom CD obtained using a reference CDSEM. The verification data of bottom CD values is obtained by using the library or MLS-trained system created using the optimized optical metrology model.

In step 322, a determination is made as to whether the collected verification data meets the metrology model goals within an acceptable range. The metrology model goals are evaluated using the appropriate formulas discussed above, using the verification data obtained in step 320. For example, if the metrology model goal is stated in terms of $3\sigma$ static precision of the bottom CD, the standard deviation equation is used with the bottom CD measurements obtained in step 320. If these metrology model goals are not met, in step 324, the metrology model goals are analyzed for validity and revised as appropriate, or the metrology model variables of the optical metrology model are revised. Steps 304 to 322 are then iterated.

An example is described to highlight the iteration of processing. Assume that a specific reflectometer is used for the particular application. Further, the optical metrology model uses the integral method for simulating the diffraction signal. Assume that static/dynamic precision and accuracy goals for measurement of the bottom CD were selected and set at less than or equal to 0.20, 0.30, and 3.0 nm, respectively. Assume that after the optical metrology model was optimized, the calculated actual static/dynamic precision and accuracy from actual measurements of the bottom CD came out to be 0.20, 0.30, and 5.0 nm, respectively. It should be noted in this example that accuracy of the bottom CD measurement using the optimized optical metrology model failed the accuracy criterion. Continuing with the example, assume that after analysis, the diffraction simulation technique was changed from the integral method to RCWA. After the optical metrology model is changed to incorporate RCWA, steps 304 to 322 are iterated.

Figure 4:
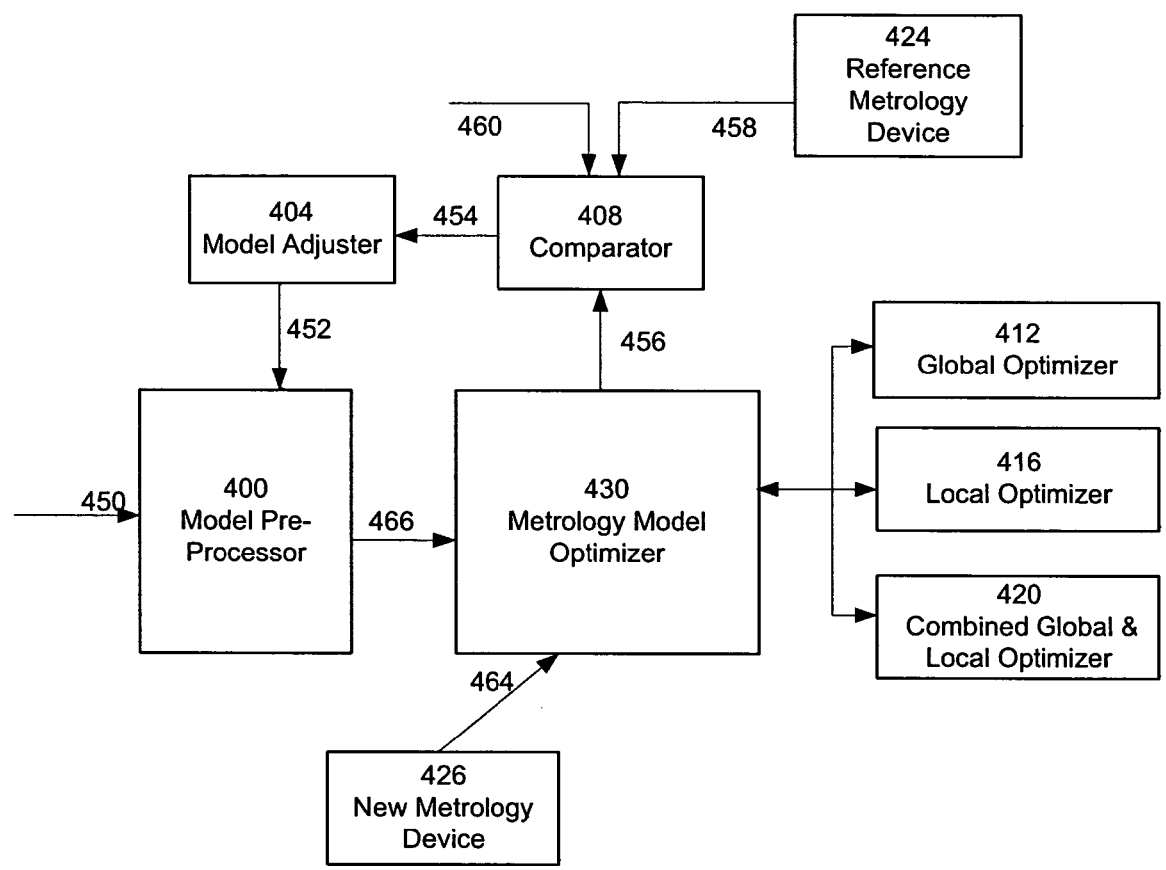
FIG. 4 is an exemplary block diagram of an exemplary system for optimizing an optical metrology model.

FIG. 4 is a block diagram of an exemplary system for optimizing an optical metrology model based on goals. In one exemplary embodiment, a model preprocessor 400 develops an optical metrology model. As described above, the optical metrology model has metrology model variables, which includes profile parameters of a profile model. A metrology model optimizer 430 optimizes the optical metrology model using fixed values for one or more selected metrology model variables of the optical metrology model. A new metrology device 426 can be used to measure one or more selected profile model parameters using the optimized optical metrology model. A comparator 408 can then determine if one or more termination are met by the measurements obtained using new metrology device 426. As described above, the one or more termination criteria include one or more goals for metrology model optimization.

In one exemplary embodiment, model preprocessor 400 accepts and processes input data 450, which can include fabrication recipe data, metrology device(s) data, optimization goals, selected profile model parameters, optimization termination criteria, values for variables determined to be fixed for the application, and metrology model assumptions. Model preprocessor 400 can develop an optical metrology model 466 based on input data 450, and transmit optical metrology model 466 to metrology model optimizer 430. New metrology device 426 can be used to measure the wafer structure (not shown), and transmit measurements 464 to metrology model optimizer 430. New metrology device 426 may be a reflectometer, ellipsometer, CDSEM, CD-AFM, XSEM, or the like. In some applications, new metrology device 426 can include one or more scatterometers, or one or more different types of optical metrology devices. Metrology model optimizer 430 can invoke a global optimizer 412, a local optimizer 416, or a combined global and local optimizer 420. Global optimizer 412, local optimizer 416, or combined global and local optimizer 420 can perform the optimization of the optical metrology model as discussed above, using measurements 464 from new metrology device 426 as input to extract the selected profile model parameter values. The extracted selected profile model parameter values and optimization termination criteria 456 are transmitted to comparator 408.

In the present exemplary embodiment, comparator 408 in FIG. 4 evaluates the goals using the profile model parameter values in transmitted data 456, which includes comparing the calculated goals to the optimization termination criteria. If one of the goals is closeness of match of measurements made with different metrology systems, then a reference metrology device 424 can be used to measure the wafer structure and to transmit measurements 458 to comparator 408. Reference metrology device 424 may be a reflectometer, ellipsometer, CDSEM, CD-AFM, XSEM, TEM, or the like. Comparator 408 calculates the goals using transmitted data 456 from metrology optimizer 430 and transmitted measurements 458, and compares the calculated goals to the optimization termination criteria to test if the termination criteria are met. It is understood that based on the goal, other input data 460, such cost of ownership, cash flow data, and the like, may be transmitted to comparator 408 for calculation of the goal and later comparison of the calculated goal to the optimization termination criteria.

Referring to FIG. 4, if the optimization termination criteria are met, then processing is complete. If the optimization termination criteria are not met, the calculated values of goal 454 are transmitted to model adjuster 404, which determines revisions to the selected model variables, revisions to the values used to set selected model variables to fixed values, revisions to the termination criteria or other revisions to the assumptions of the optical metrology model. Revisions 452 to the optical metrology model are transmitted to model preprocessor 400 for another iteration of the metrology model optimization process.

It should be recognized that model preprocessor 400, metrology model optimizer 430, comparator 408, and model adjuster 404 can be embodied as any number of hardware, software, or combination of hardware and software components or modules. Similarly, global optimizer 412, local optimizer 416, and combined global and local optimizer 420 can be embodied as any number of hardware, software, or combination of hardware and software components or modules.

Figure 5:
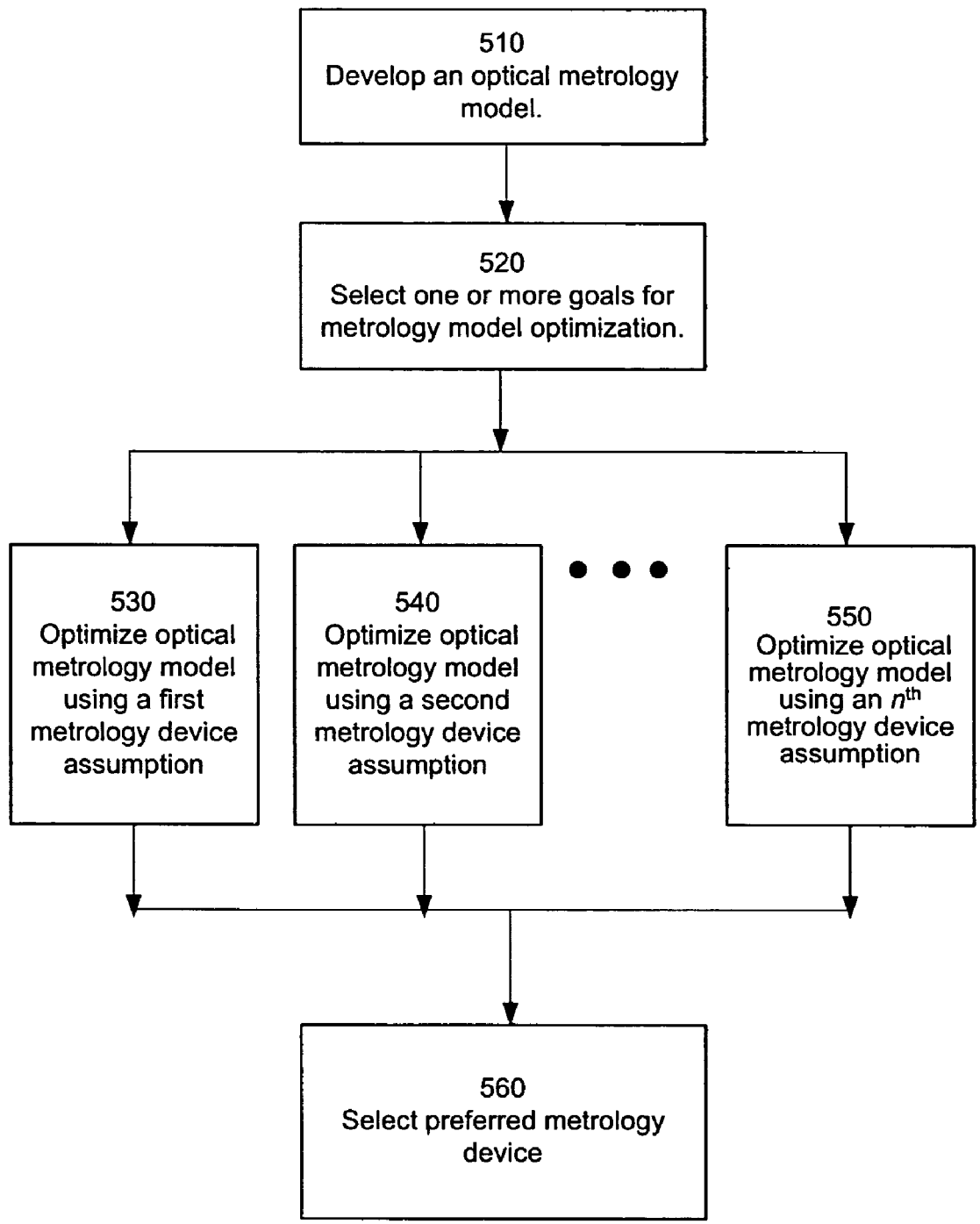
FIG. 5 is another exemplary process for optimizing an optical metrology model.

FIG. 5 depicts an exemplary process for optimizing an optical metrology model for use in measuring a wafer structure. In step 510, an initial optical metrology model is developed. In step 520, one or more goals for metrology model optimization are selected. As described above, the one or more goals for metrology model optimization can include precision, accuracy, critical dimension uniformity, correlation coefficient, goodness-of-fit, cost function, figure of merit, throughput, closeness of match of measurements made with different metrology devices, cost of ownership, and/or return on investment.

In step 530, the initial optical metrology model is optimized to obtain a first optimized optical metrology model using a first metrology device assumption that includes one or more characteristics of a first metrology device that can be used to measure the wafer structure. The first metrology device assumption may include specific data about the first metrology device from a specific manufacturer. For example, the first metrology device may be a broadband, non-polarized reflectometer. One of the characteristics of the first metrology device included in the first metrology device assumption can be that the angle of incidence of the incident beam used in the first metrology device is set to zero relative to normal. If the first metrology device is assumed to be a specific reflectometer from a specific manufacturer, then the characteristics of the first metrology device can include data related to beam intensity, wavelength calibration error, spectrometer resolution, azimuth angle, and numerical aperture. If an ellipsometer is assumed, then the characteristics of the first metrology device can include data related to the angle of incidence (AOI), AOI uncertainty, wavelength of incident beam, wavelength calibration error, spectrometer resolution, wavelength mixing, polarization dependent loss, phase calibration error, and the like.

In step 540, the initial optical metrology model is optimized to obtain at least a second optimized optical metrology model using at least a second metrology device assumption that includes one or more characteristics of at least a second metrology device that can be used to measure the wafer structure. Similar to the first metrology device assumption, the second device assumption may include specific data about the second metrology device from a specific manufacturer. Note, however, that the first and second metrology device assumptions are different. In particular, at least one characteristic of the first and at least second metrology devices is different. For example, the first metrology device can be assumed to be a reflectometer, and the second metrology device can be assumed to be an ellipsometer.

As indicated by the ellipsis after step 540, the initial optical metrology model can be optimized to obtain any number of additional optimized optical metrology models using any number of additional metrology device assumptions. For example, in step 550 of FIG. 5, the initial optical metrology model can be optimized to obtain an $n^{th}$ optimized optical metrology model using an $n^{th}$ metrology device assumption.

In step 560, a preferred metrology device is selected based on the various optimized metrology models (i.e., the first optimized optical metrology model and the at least second optimized optical metrology model, which potentially includes the $n^{th}$ optimized optical metrology model) and the one or more goals selected in step 520. In particular, in one exemplary embodiment, the various optimized optical metrology models are used to obtain measurements of the wafer structure using the corresponding metrology devices (i.e., the first metrology device and the at least second metrology device, which potentially includes the $n^{th}$ metrology device). The one or more goals selected in step 520 are evaluated using the obtained measurements. The preferred metrology device selected in step 560 has characteristics that are most similar to the metrology device assumption of the optical metrology model that produced the measurements that best meets the one or more goals selected in step 520.

For example, assume the one or more goals selected in step 520 included static and dynamic precision, which are set at 0.02 nm and 0.06 nm, respectively. Assume that three optimized optical metrology models are obtained using three metrology device assumptions. In particular, assume that three metrology device assumptions included assuming that the three metrology devices were a regular non-polarized reflectometer, a polarized reflectometer, and an ellipsometer. Now assume that the static and dynamic precision produced by using the optimized optical metrology model corresponding to the metrology device assumption that the metrology device is a polarized reflectometer is 0.015 nm and 0.045 nm, respectively, and best meets the static and dynamic precision goal of 0.02 nm and 0.06 nm, respectively. Thus, in this example, a polarized reflectometer is selected as the preferred metrology device.

Figure 6:
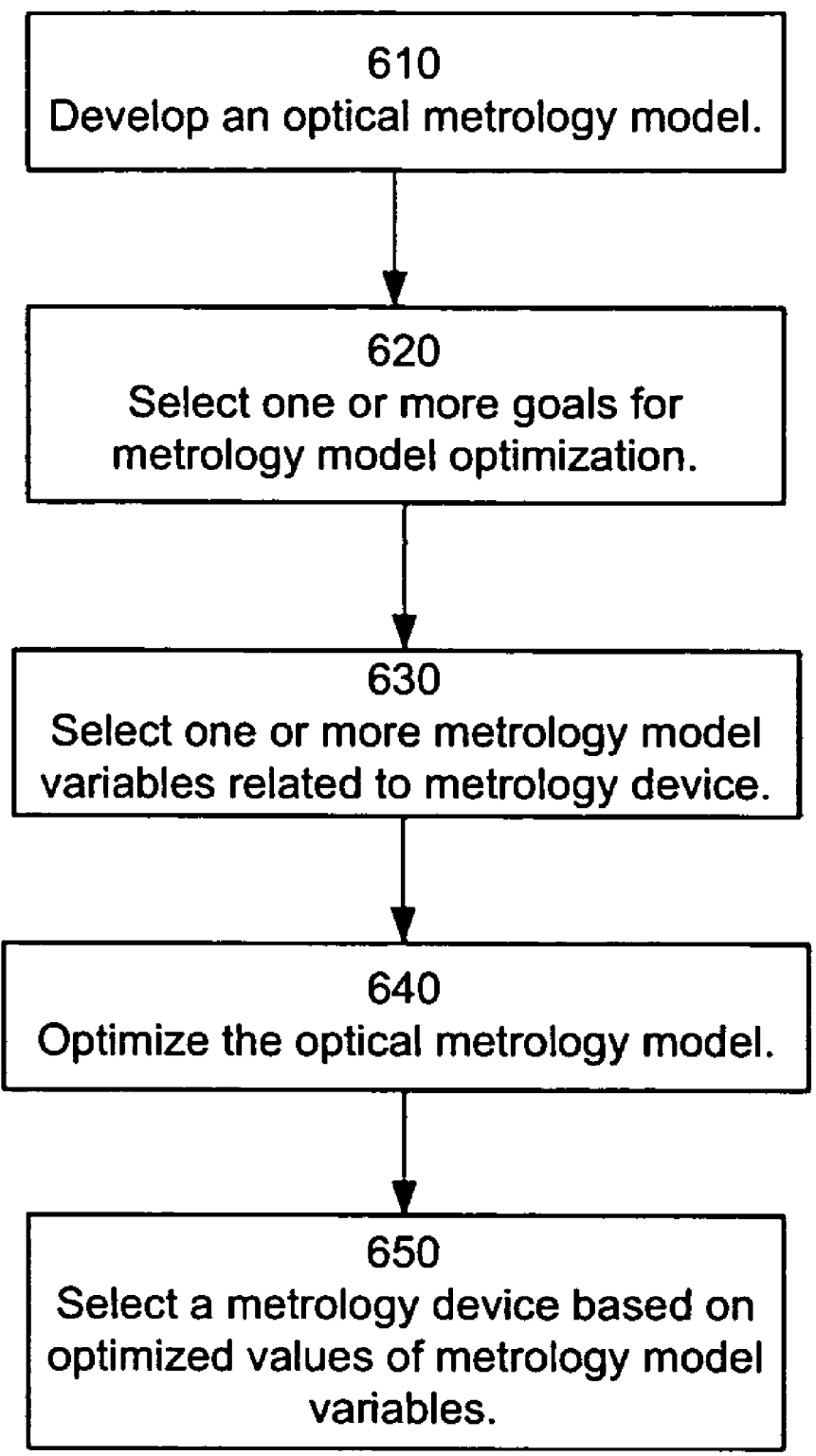
FIG. 6 is still another exemplary process for optimizing an optical metrology model.

FIG. 6 depicts an exemplary process for optimizing an optical metrology model for use in measuring a wafer structure. In step 610, an optical metrology model is developed. In step 620, one or more goals for metrology model optimization are selected. The one or more goals for metrology model optimization can include precision, accuracy, critical dimension uniformity, correlation coefficient, goodness-of-fit, cost function, figure of merit, throughput, closeness of match of measurements made with different metrology devices, cost of ownership, and/or return on investment.

In step 630, one or more metrology model variables of the optical metrology model related to metrology devices are selected to be set to fixed values. As mentioned above, metrology model variables related to metrology devices can include wavelength of the incident beam, AOI, beam intensity, wavelength calibration error, polarization dependent loss, spectrometer resolution, azimuth angle, numerical aperture, and the like. In step 640, the optical metrology model is optimized with the selected metrology model variables related to metrology devices allowed to float over a range of values. Note that the metrology model variables related to metrology devices not selected in step 630 may be set to fixed values. The results of the optimization process can include profile model parameters and optimized values of the selected metrology model variables related to optical metrology devices. In step 650, a metrology device is selected based on the optimized values of the selected metrology device variables related to optical metrology devices.

For example, assume that accuracy is the one or more goals selected in step 620, with the accuracy goal set at an absolute value of 3 nm. Further, assume the metrology model variables related to metrology devices that are allowed to float over a range in the optimization process include wavelength range, AOI, and azimuth angle. Now assume that the optimized values for the metrology model variables related to metrology devices that were allowed to float during the optimization process are a wavelength range of 300 to 820 nm, an AOI of 45 degrees from normal, and an azimuth angle of 5 degrees. Thus, in this example, a metrology device that can operate with a wavelength range of 300 to 820 nm, an AOI of 45 degrees from normal, and an azimuth angle of 5 degrees would be selected. If a variety of metrology devices were available in a fabrication site, then the metrology device that meets the optimized metrology hardware variables would be selected for the specific semiconductor application. Alternatively, metrology devices may have an operating AOI, wavelength, and azimuth angle range. The values for AOI, wavelength, and azimuth angle from the optimization run would be used to set the metrology device for the given application.

Although exemplary embodiments have been described, various modifications can be made without departing from the spirit and/or scope of the present invention. For example, a first iteration may be run with a high number of variables allowed to float. After the first iteration, variables that do not produce significant changes to the diffraction response may be set to fixed values. Alternatively, variables initially considered constant due to previous empirical data may be allowed to float after further analyses. Therefore, the present invention should not be construed as being limited to the specific forms shown in the drawings and described above but based on the claims below.

We claim:

1. A method of evaluating optimization of an optical metrology model for use in measuring a wafer structure, the method comprising:
   a) developing an optical metrology model, the optical metrology model having metrology model variables, which includes profile model parameters of a profile model;
   b) selecting one or more goals for metrology model optimization;
   c) selecting one or more profile model parameters to be used in evaluating the one or more selected goals;
   d) selecting one or more metrology model variables to be set to fixed values;
   e) setting the one or more selected metrology model variables to fixed values;
   f) setting one or more termination criteria for the one or more selected goals;
   g) optimizing the optical metrology model using the fixed values for the one or more selected metrology model variables;
   h) obtaining measurements for the one or more selected profile model parameters using the optimized optical metrology model; and
   i) determining if the one or more termination criteria are met by the obtained measurements.

2. The method of claim 1 wherein developing the optical metrology model comprises:
   specifying metrology model variables of the optical metrology model related to a fabrication recipe;
   specifying metrology model variables of the optical metrology model related to one or more metrology devices;
   specifying metrology model variables of the optical metrology model related to simulation technique;
   specifying metrology model variables of the optical metrology model related to materials used in the structure; and
   specifying metrology model variables of the optical metrology model related to the profile model of the structure.

3. The method of claim 2 wherein the metrology model variables of the optical metrology model related to one or more metrology devices include wavelength of the incident beam or beams, the angle of incidence of the incident beam, beam intensity, wavelength calibration error, polarization dependent loss, spectrometer resolution, azimuth angle, and/or numerical aperture.

4. The method of claim 2 wherein the metrology model variables of the optical metrology model related to the simulation technique include wavelength analyzed, resolution, diffraction orders, and diffraction simulation algorithm.

5. The method of claim 4 wherein the diffraction simulation algorithm includes rigorous coupled-wave analysis (RCWA), modal analysis, integral method, Green's functions, Fresnel method, or finite element analysis.

6. The method of claim 2 wherein the metrology model variables of the optical metrology model related to materials used in the structure include refractive index and extinction coefficient.

7. The method of claim 2 wherein the metrology model variables of the optical metrology model related to the profile model of the structure include thickness of underlying films, pitch, width of structure at various heights, height of structure, sidewall angle, and/or footing.

8. The method of claim 1 wherein the one or more goals for metrology model optimization selected in b) include precision, accuracy, critical dimension uniformity, correlation coefficient, goodness-of-fit, cost function, figure of merit, throughput, closeness of match of measurements made with different metrology devices, cost of ownership, and/or return on investment.

9. The method of claim 8 wherein precision includes static, dynamic, and/or long term precision.

10. The method of claim 8 wherein closeness of match of measurements made with different metrology devices includes absolute measurement difference, average correlation ratio between a metrology system to a reference metrology system, standard mean deviation ($\sigma$), multiples of standard mean deviation, and/or total measurement uncertainty.

11. The method of claim 1 wherein the one or more goals selected in b) include static and dynamic precision of measurement, and wherein the one or more profile model parameters selected in c) include a bottom width of the structure.

12. The method of claim 1 wherein the one or more goals selected in b) include accuracy of measurement, and wherein the one or more profile model parameters selected in c) include a middle critical dimension of the structure.

13. The method of claim 1 wherein the one or more goals selected in b) include total measurement uncertainty (TMU) and/or critical dimension uniformity, and wherein the one or more profile model parameters selected in c) include a middle critical dimension of the structure.

14. The method of claim 1 wherein the one or more metrology model variables selected in d) include metrology model variables related to metrology devices.

15. The method of claim 1 wherein the one or more metrology model variables selected in d) include metrology model variables related to materials of the structure.

16. The method of claim 1 wherein the one or more metrology model variables selected in d) include metrology model variables related to the profile model of the structure.

17. The method of claim 1 wherein the one or more termination criteria set in f) include ranges of precision, accuracy, critical dimension uniformity, correlation coefficient, goodness-of-fit, cost function, throughput, closeness of match of measurements made with different metrology devices, cost of ownership, and/or return on investment.

18. The method of claim 1 wherein the one or more termination criteria set in f) include a range of total measurement uncertainty of measurements made with a new metrology device compared to a reference metrology device.

19. The method of claim 1 wherein optimization of the optical metrology model performed in g) includes utilizing global optimization techniques.

20. The method of claim 19 wherein the global optimization technique includes simulated annealing, genetic algorithms, tabu search, neural networks, or branch-and-bound technique.

21. The method of claim 1 wherein optimization of the optical metrology model performed in g) includes utilizing local optimization techniques.

22. The method of claim 1 wherein optimization of the optical metrology model performed in g) includes utilizing a combination of global and local optimization techniques.

23. The method of claim 22 wherein optimization of the optical metrology model performed in g) includes utilizing a combination of genetic algorithms and a local optimization technique.

24. The method of claim 22 wherein optimization of the optical metrology model performed in g) includes utilizing a combination of simulated annealing and a local optimization technique.

25. The method of claim 1 wherein if the one or more termination criteria are not met in i):
j) revising the selection of metrology model variables in d) and/or the fixed values set to the selected metrology model variables in e); and
k) iterating steps g), h), and i).

26. The method of claim 25 wherein revising the selection of metrology model variables comprises allowing one or more metrology model variables to float instead of being set to fixed values.

27. The method of claim 25 wherein revising selection of metrology model variables comprises setting one or more metrology model variables to fixed values instead of being allowed to float.

28. The method of claim 1 wherein if the one or more termination criteria are not met in i):
changing the termination criteria; or
adding additional termination criteria.

29. The method of claim 1 wherein if the one or more termination criteria are met in i):
collecting verification data using the optimized optical metrology model; and
determining if the collected verification data meet the one or more selected goals within acceptable ranges.

30. The method of claim 29 wherein if the collected verification data do not meet the one or more selected goals within acceptable ranges:
revising the selection of the one or more metrology model goals in b); or
revising one or more of metrology model variables of the optical metrology model.

31. The method of claim 30 wherein revising one or more metrology model variables of the optical metrology model include changing diffraction simulation technique to rigorous coupled-wave analysis (RCWA), modal analysis, integral method, Green's functions, Fresnel method, or finite element analysis.

32. A method of evaluating optimization of an optical metrology model for use in measuring a wafer structure, the method comprising:
a) developing an initial optical metrology model;
b) selecting one or more goals for metrology model optimization;
c) optimizing the initial optical metrology model to obtain a first optimized optical metrology model using a first metrology device assumption that includes one or more characteristics of a first metrology device that can be used to measure the wafer structure;
d) optimizing the initial optical metrology model to obtain at least a second optimized optical metrology model using a second metrology device assumption that includes one or more characteristics of a second metrology device that can be used to measure the wafer structure, wherein the first and second metrology device assumptions differ; and
e) selecting a preferred metrology device based on the first and at least second optimized optical metrology models and the one or more selected goals.

33. The method of claim 32 wherein e) comprises:
obtaining measurements of the wafer structure using the first and at least second optimized optical metrology models;
evaluating the one or more selected goals using the obtained measurements;
when the obtained measurements using the first optimized optical metrology model better meets the one or more selected goals, selecting as the preferred metrology device a metrology device with characteristics that are most similar to the first metrology device; and
when the obtained measurements using the at least second optimized optical metrology model better meets the one or more selected goals, selecting as the preferred metrology device a metrology device with characteristics that are most similar to the second metrology device.

34. The method of claim 33 wherein the measurements of the wafer structure are obtained using the first and at least second optical metrology devices.

35. The method of claim 32 wherein the characteristics of the first or second metrology device include angle of incidence of an incident beam.

36. The method of claim 32 wherein the characteristics of the first or second metrology device include beam intensity, wavelength calibration error, spectrometer resolution, azimuth angle, and numerical aperture.

37. The method of claim 32 wherein the first metrology device is a reflectometer, and wherein the second metrology device is an ellipsometer.

38. The method of claim 32 wherein the one or more goals for metrology model optimization selected in b) include precision, accuracy, critical dimension uniformity, correlation coefficient, goodness-of-fit, cost function, figure of merit, throughput, closeness of match of measurements made with different metrology devices, cost of ownership, and/or return on investment.

39. A method of evaluating optimization of an optical metrology model for use in measuring a wafer structure, the method comprising:
a) developing an optical metrology model having one or more optical metrology variables related to metrology devices;
b) selecting one or more goals for metrology model optimization;
c) selecting one or more of the metrology model variables related to optical metrology devices;
d) optimizing the optical metrology model with the one or more selected metrology model variables related to optical metrology devices allowed to float over a range of values; and
e) selecting a metrology device based on optimized values of the one or more selected metrology model variables obtained from the optimized optical metrology model.

40. The method of claim 39 wherein the one or more selected metrology model variables related to optical metrology devices include angle of incidence, azimuth angle, and/or wavelength.

41. The method of claim 39 wherein the one or more goals for metrology model optimization selected in b) include precision, accuracy, critical dimension uniformity, correlation coefficient, goodness-of-fit, cost function, figure of merit, throughput, closeness of match of measurements made with different metrology devices, cost of ownership, and/or return on investment.

42. A system for evaluating optimization of an optical metrology model for use in measuring wafer structures, the system comprising:
a model preprocessor configured to develop an optical metrology model having metrology model variables, which includes profile parameters of a profile model;

a metrology model optimizer configured to optimize the optical metrology model using fixed values for one or more selected metrology model variables of the optical metrology model;

a first metrology device configured to measure one or more selected profile model parameters using the optimized optical metrology model; and a comparator configured to determine if one or more termination criteria are met by the measurements obtained using the first metrology device, wherein the one or more termination criteria include one or more goals for metrology model optimization.

43. The system of claim 42 further comprising:

a model adjuster configured to receive data from the comparator, to revise the one or more selected metrology model variables, and to revise fixed values for the one or more selected metrology model variables.

44. The system of claim 42 wherein the model preprocessor is configured to process input data, including fabrication recipe data, metrology device data, optimization goals, selected profile model parameters, optimization termination criteria, fixed values for metrology model variables.

45. The system of claim 44 wherein the metrology model optimizer is configured to receive transmitted data from the model preprocessor and the first metrology device, to invoke a global optimizer, a local optimizer, or a combined global and local optimizer, and to extract values of the selected profile model parameter measurements from the first metrology device, and to transmit the extracted values and optimization termination criteria.

46. The system of claim 45, wherein the comparator is configured to receive the values and optimization termination criteria, and to evaluate the optimization goals based on the received values.

47. The system of claim 42 wherein the first metrology device is a scatterometric device.

48. The system of claim 47 wherein the scatterometric device is a reflectometer or ellipsometer.

49. The system of claim 42 wherein the metrology optimizer includes a global optimizer, which includes a simulated annealing, genetic algorithm, tabu search, neural network, or branch-and-bound technique.

50. The system of claim 42 wherein the metrology optimizer includes a local optimizer, which includes steepest descent or hill climber.

51. The system of claim 42 further comprising a second metrology device configured to measure the one or more selected profile model parameters.

52. The system of claim 51 wherein the second metrology device is a critical dimension scanning electron microscope, a critical dimension atomic force microscope, a cross section scanning electron microscope, a transmission electron microscope, or a scatterometer.

53. A computer-readable storage medium containing computer executable instructions for causing a computer to optimize an optical metrology model for use in measuring a wafer structure, comprising instructions for:

a) developing an optical metrology model, the optical metrology model having metrology model variables, which includes profile model parameters of a profile model;

b) selecting one or more goals for metrology model optimization;

c) selecting one or more profile model parameters to be used in evaluating the one or more selected goals;

d) selecting one or more metrology model variables to be set to fixed values;

e) setting the one or more selected metrology model variables to fixed values;

f) setting one or more termination criteria for the one or more selected goals;

g) optimizing the optical metrology model using the fixed values for the one or more selected metrology model variables;

h) obtaining measurements for the one or more selected profile model parameters using the optimized optical metrology model; and i) determining if the one or more termination criteria are met by the obtained measurements.

54. A computer-readable storage medium containing computer executable instructions for causing a computer to optimize an optical metrology model for use in measuring a wafer structure, comprising instructions for:

a) developing an initial optical metrology model;

b) selecting one or more goals for metrology model optimization;

c) optimizing the initial optical metrology model to obtain a first optimized optical metrology model using a first metrology device assumption that includes one or more characteristics of a first metrology device that can be used to measure the wafer structure;

d) optimizing the initial optical metrology model to obtain at least a second optimized optical metrology model using a second metrology device assumption that includes one or more characteristics of a second metrology device that can be used to measure the wafer structure, wherein the first and second metrology device assumptions differ; and e) selecting a preferred metrology device based on the first and at least second optimized optical metrology models and the one or more selected goals.

55. A computer-readable storage medium containing computer executable instructions for causing a computer to optimize an optical metrology model for use in measuring a wafer structure, comprising instructions for:

a) developing an optical metrology model having one or more optical metrology variables related to metrology devices;

b) selecting one or more goals for metrology model optimization;

c) selecting one or more of the metrology model variables related to optical metrology devices;

d) optimizing the optical metrology model with the one or more selected metrology model variables related to optical metrology devices allowed to float over a range of values; and e) selecting a metrology device based on optimized values of the one or more selected metrology model variables obtained from the optimized optical metrology model.

* * * * *